United States Patent

Pandey

(10) Patent No.: US 9,982,991 B2
(45) Date of Patent: May 29, 2018

(54) METHOD FOR CONTROLLING A DISTANCE BETWEEN TWO OBJECTS, INSPECTION APPARATUS AND METHOD

(71) Applicant: ASML Netherlands B.V., Veldhoven (NL)

(72) Inventor: Nitesh Pandey, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 197 days.

(21) Appl. No.: 14/838,252

(22) Filed: Aug. 27, 2015

(65) Prior Publication Data
US 2016/0061590 A1 Mar. 3, 2016

(30) Foreign Application Priority Data

Aug. 29, 2014 (EP) .................................... 14182858

(51) Int. Cl.
*G01B 11/14* (2006.01)
*G03F 9/00* (2006.01)
*G03F 7/20* (2006.01)

(52) U.S. Cl.
CPC .......... *G01B 11/14* (2013.01); *G03F 7/70625* (2013.01); *G03F 7/70633* (2013.01); *G03F 9/703* (2013.01); *G03F 9/7007* (2013.01)

(58) Field of Classification Search
None
See application file for complete search history.

(56) References Cited

U.S. PATENT DOCUMENTS

| 4,765,742 A * | 8/1988 | Davinson ............... G01B 11/14 250/227.28 |
| 5,280,340 A | 1/1994 | Lacey |

(Continued)

FOREIGN PATENT DOCUMENTS

| JP | 4626121 B2 | 2/2011 |
| TW | 201226891 A | 7/2012 |

(Continued)

OTHER PUBLICATIONS

English Language Abstract of Taiwanese Patent Publication No. TW 201428230 A, published Jul. 16, 2014; 1 page.

(Continued)

*Primary Examiner* — Kara E Geisel
*Assistant Examiner* — Jarreas C Underwood
(74) *Attorney, Agent, or Firm* — Sterne, Kessler, Goldstein & Fox, P.L.L.C.

(57) ABSTRACT

A broadband spectroscopic analysis is used for controlling a distance (d) between a miniature solid immersion lens (SIL, 60) and a metrology target (30'). An objective lens arrangement (15, 60) including the SIL illuminates the metrology target with a beam of radiation with different wavelengths and collects a radiation (709) reflected or diffracted by the metrology target. A mounting (64) holds the SIL within a distance from the metrology target that is less than the coherence length of the illuminating radiation (703). A detection arrangement (812, 818) produces a spectrum of the radiation reflected or diffracted by the metrology target. The distance between the SIL and the metrology target or other target surface can be inferred from spectral shifts observed in the detected spectrum. Servo control of the distance is implemented based on these shifts, using an actuator (66).

20 Claims, 8 Drawing Sheets

(56) References Cited

U.S. PATENT DOCUMENTS

| | | | |
|---|---|---|---|
| 5,412,474 A * | 5/1995 | Reasenberg | G01B 9/02003 356/4.09 |
| 5,475,488 A | 12/1995 | Fukuzawa et al. | |
| 5,502,565 A | 3/1996 | Fukuzawa et al. | |
| 5,953,125 A | 9/1999 | de Groot | |
| 6,401,460 B1 * | 6/2002 | Xia | F01D 11/24 415/14 |
| 6,678,060 B2 * | 1/2004 | Heyworth | G01B 11/026 356/614 |
| 6,688,743 B1 | 2/2004 | Durnin et al. | |
| 6,717,896 B1 | 4/2004 | Imanishi | |
| 6,934,024 B2 * | 8/2005 | Zhan | G01J 4/00 356/369 |
| 7,106,454 B2 * | 9/2006 | De Groot | G01B 11/0675 356/497 |
| 7,612,891 B2 * | 11/2009 | Wan | G01B 11/0675 356/503 |
| 7,990,521 B2 * | 8/2011 | Ueno | G01P 3/366 356/3.01 |
| 9,500,471 B2 * | 11/2016 | Michell | G01B 11/0608 |
| 9,633,427 B2 | 4/2017 | Bozkurt et al. | |
| 2005/0012928 A1 | 1/2005 | Sezginer et al. | |
| 2006/0033921 A1 | 2/2006 | Den Boef et al. | |
| 2006/0066855 A1 | 3/2006 | Boef et al. | |
| 2006/0291059 A1 * | 12/2006 | Heyworth | G01B 11/14 359/570 |
| 2007/0242583 A1 | 10/2007 | Huang et al. | |
| 2008/0089208 A1 * | 4/2008 | Verschuren | G11B 7/08511 369/112.23 |
| 2008/0137064 A1 * | 6/2008 | Arata | G01N 21/8806 356/36 |
| 2009/0290794 A1 | 11/2009 | Marchesotti | |
| 2009/0316979 A1 | 12/2009 | Gidon | |
| 2010/0084785 A1 | 4/2010 | Masuhara et al. | |
| 2010/0201963 A1 | 8/2010 | Cramer et al. | |
| 2010/0328655 A1 | 12/2010 | Den Boef | |
| 2011/0027704 A1 | 2/2011 | Cramer et al. | |
| 2011/0043791 A1 | 2/2011 | Smilde et al. | |
| 2011/0069292 A1 | 3/2011 | Den Boef | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2012/0162962 A1 * | 6/2012 | Gladnick | G01J 3/10 362/84 |
| 2012/0242970 A1 | 9/2012 | Smilde et al. | |
| 2013/0114061 A1 | 5/2013 | de Groot et al. | |
| 2013/0258310 A1 | 10/2013 | Smilde et al. | |
| 2013/0271740 A1 | 10/2013 | Quintanilha | |
| 2014/0136137 A1 | 5/2014 | Tarshish-Shapir et al. | |
| 2014/0139814 A1 | 5/2014 | Cramer et al. | |
| 2014/0204397 A1 | 7/2014 | Smilde et al. | |
| 2014/0334735 A1 | 11/2014 | Pitts et al. | |
| 2015/0138523 A1 | 5/2015 | Jak et al. | |
| 2016/0086324 A1 | 3/2016 | Bozkurt et al. | |

FOREIGN PATENT DOCUMENTS

| | | |
|---|---|---|
| TW | 201333432 A | 8/2013 |
| TW | 201428230 A | 7/2014 |
| WO | WO 2013/178422 A1 | 12/2013 |
| WO | WO 2014/082938 A1 | 6/2014 |

OTHER PUBLICATIONS

English-Language Abstract for Japanese Patent Publication No. 4626121 B2, published Feb. 2, 2011; 1 page.

Chen, T., et al., "Experimental investigation of solid immersion lens lithography," Proceedings of SPIE: Optical Microlithography XVIII, vol. 5754, 2005; pp. 254-261.

El Gawhary, O., et al., "Performance analysis of coherent optical scatterometry," Applied Physics B, vol. 105, 2011; pp. 775-781.

Ghislain, L.P., et al., "Near-field scanning solid immersion microscope," Physics Letters, vol. 72, No. 22, Jun. 1, 1998; pp. 2779-2781.

Kumar, N., et al., "Coherent Fourier Scatterometry (Tool for improved sensitivity in semiconductor metrology)," Proceedings of SPIE: Metrology, Inspection, and Process Control for Microlithography XXVI, vol. 8324, 2012; pp. 83240Q-1 to 83240Q-8.

International Search Report directed to related International Patent Application No. PCT/EP2015/068925, dated Jan. 20, 2016; 3 pages.

International Preliminary Report on Patentability directed to related International Patent Application No. PCT/EP2015/068925; dated Feb. 28, 2017; 6 pages.

"Central tendency," Wikipedia—the free encyclopedia, accessed at http://en.wikipedia.org/wiki/Central_tendency on Aug. 26, 2014; 4 pages.

"Statistical dispersion," Wikipedia—the free encyclopedia, accessed at http://en.wikipedia.org/wiki/Statistical_dispersion on Aug. 26, 2014; 3 pages.

International Search Report and Written Opinion of the International Searching Authority directed to related International Patent Application No. PCT/EP2015/069168, dated Jun. 23, 2016; 8 pages.

\* cited by examiner

METHOD FOR CONTROLLING A DISTANCE BETWEEN TWO OBJECTS, INSPECTION APPARATUS AND METHOD

FIELD

The present invention relates to a method and associated apparatus for controlling a distance between two objects. As a particular application, the invention may be applied to controlling a gap between an optical element and a reflective or diffractive surface. The present invention is usable, for example, in the inspection of devices manufactured by lithographic techniques, to measure overlay error or other parameters.

BACKGROUND

A lithographic apparatus is a machine that applies a desired pattern onto a substrate, usually onto a target portion of the substrate. The pattern may be applied via imaging onto a layer of radiation-sensitive material (resist) provided on the substrate. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle. One particular application of scatterometry is in the measurement of feature asymmetry within a period target. This can be used as a measure of overlay error, for example, but other applications are also known. In angle resolved scatterometers, asymmetry can be measured by comparing opposite parts of the diffraction spectrum (for example comparing the −1st and +1$^{st}$ orders in the diffraction spectrum of a periodic grating. This can be done simply in angle-resolved scatterometry, as is described for example in published patent application US2006066855A1. With reduction of the physical dimensions in lithographic processing, there is demand to reduce the space occupied by targets dedicated to metrology. Image based scatterometry measurements have been devised to allow the use of smaller targets, by taking separate images of the target using −1$^{st}$ and +1$^{st}$ order radiation in turn. Examples of this image based technique are described in published patent applications US20110027704A, US20110043791A and US20120044470.

Demand for further reduction in target size continues, however, and the existing techniques suffer from various constraints that make it difficult to maintain accuracy while reducing the size of the targets. An example of an angularly resolved scatterometer comprising a Solid Immersion Lens (SIL) is disclosed in published patent application US 2009316979 A1. The extreme proximity of the SIL with the target results in a very high effective NA larger than 1. Using a coherent light source with this SIL allows a very small target to be inspected.

To take advantage of the increasing numerical aperture, the gap between the SIL and the target needs to be set and maintained to an optimal value. For example, the gap may be within the range of 10-50 nm to maintain the SIL in effective optical contact with the substrate. SILs are known for use in optical recording. An optical gap measuring method and apparatus for an optical recorder is described for example in patent U.S. Pat. No. 5,953,125 A. The gap in that example is controlled by detecting cross components of polarization in the high numerical aperture element. The cross polarized signal is then recorded by a detector and can be used as an input parameter into a gap control process. A gap control method based on the detection of cross polarized component signal is expected to be a robust method when applied to media such as optical disks where the substrate is uniform (e.g. Aluminum coated grooved substrate with a photosensitive medium). However, for applications involving a wider variety of targets, possibly of unknown structure or composition, known techniques can fail to work with certain samples.

However, when the known techniques for gap measurement are applied to semiconductor metrology some issues may arise. For instance, if a same light source is used for illuminating the target and for generating an air gap control signal, then the requirement for the source power becomes high. If a monochromatic light source is used for generating an air gap control signal, process dependent issues may appear. For example there is a strong possibility that some target layers will exhibit a low to almost zero light reflectivity at a given wavelength. Using a monochromatic light source also creates problems due to speckle noise in the imaging system.

A microscope including a SIL is disclosed in Ghislain et al. Appl. Phys. Lett., Vol. 72, No. 22, 1 Jun. 1998. The gap in this example is controlled by reference to reflected laser light intensity. As the tip approaches the sample, reflections from the SIL and the sample interfere, and the reflected intensity oscillates with a period equal to $\lambda/2$. This interference effect is used to bring the sample into the near field of the SIL. In addition, it is mentioned that white light interference between the curved surface of the SIL probe tip and the sample produces a pattern of Newton's rings (intensity oscillates as a function of radial position) that also provide a measure of the tip-sample gap.

SUMMARY

It is an aim of the present disclosure to provide alternative methods for controlling the very small gap between an SIL and a target. The disclosed methods may be applied in inspection apparatuses such as microscopes and scatterometers. The disclosed methods may also be applied in applications such as optical recording.

According to a first aspect of the present invention, there is provided a method for monitoring a gap between an optical element and a target surface, the method comprising the steps:

(a) positioning a target surface at a distance relative to the optical element;

(b) using the optical element to illuminate a part of the target surface with radiation comprising different wavelengths;

(c) collecting radiation reflected by the target surface back into the optical element;

(d) measuring an electromagnetic spectrum of the collected radiation; and (e) deriving information about the distance between the optical arrangement and the target surface based on a shift in wavelength of one or more features in the spectrum.

The inventors have recognized that, when the gap between an element such as an SIL and a target surface is less than a coherence length of the radiation, a spectral shift can be used as a measure of the gap itself. Rather than peaks and troughs in a reflectance spectrum causing the method of monitoring the gap to be unreliable, movements of these peaks and troughs up and down the spectrum can be exploited as a measure of the distance.

The method may further comprise adjusting the distance between the optical element and the target surface in response to the distance information derived in step (e). Steps (b) to (f) may be repeated continuously to implement servo control of the distance between the optical element and the target surface.

In one embodiment useful in metrology, the optical element is all or part of an objective lens system of an inspection apparatus.

The invention in a second aspect provides an apparatus for monitoring a gap between an optical element and a target surface, the apparatus comprising:

support apparatus for supporting a target surface and an optical element in proximity to one another with a distance between them;

an illumination optical system for delivering through the optical element radiation to illuminate a part of the target surface, the radiation comprising different wavelengths;

a collecting optical system for collecting from the optical element radiation reflected by the target surface back into the optical element;

a spectrometer for measuring an electromagnetic spectrum of the collected radiation; and a processor for identifying a shift in wavelength of one or more features in the measured spectrum and for deriving from the measured shift information about the distance between the optical element and the target surface.

The invention in a third aspect provides an inspection apparatus comprising an optical system for optically inspecting target structures on a substrate, wherein the optical system of the inspection apparatus includes the optical element of an apparatus according to the second aspect of the invention, as set forth above.

The invention in a fourth aspect provides a computer program product, for example a computer readable storage medium comprising program code that, when executed by a processor in an optical apparatus, is arranged to identify a shift in wavelength of one or more features in a measured spectrum and to derive from the measured shift information about the distance between an optical element and a target surface.

The computer program product further comprises instructions for implementing servo control of the distance.

These and other features and benefits of the invention will be apparent from a consideration of the examples illustrated in the drawings and described further below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figure 1:
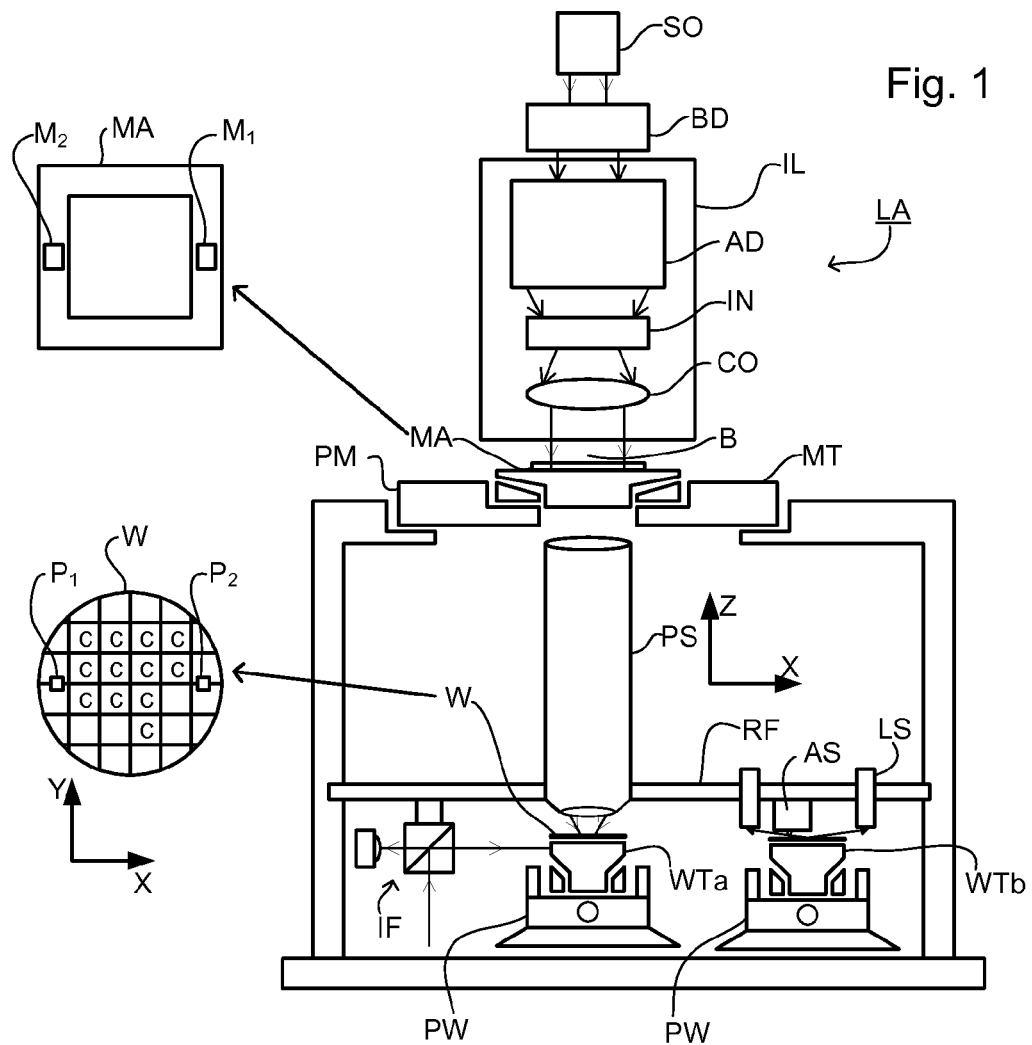
FIG. 1 depicts a lithographic apparatus.

FIG. 1 schematically depicts a lithographic apparatus. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
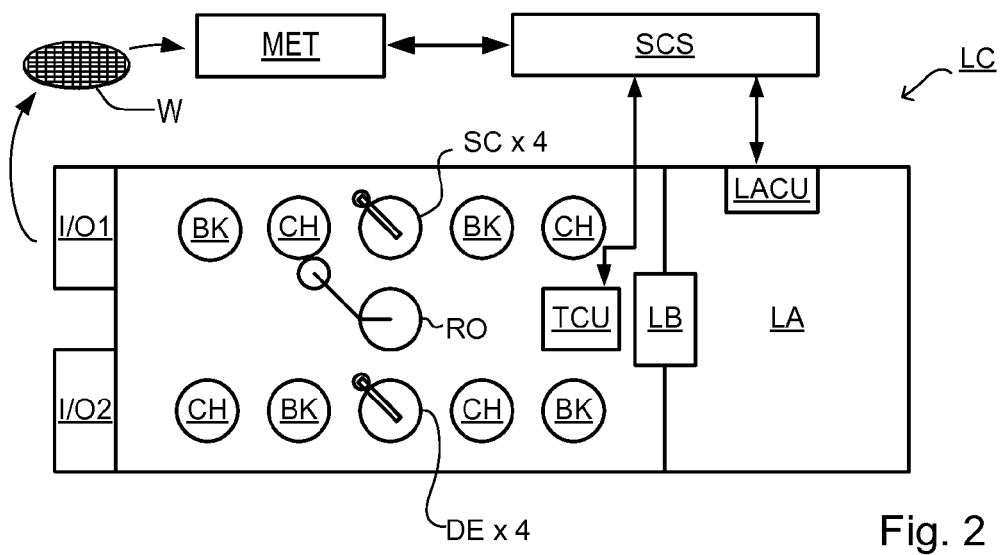
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
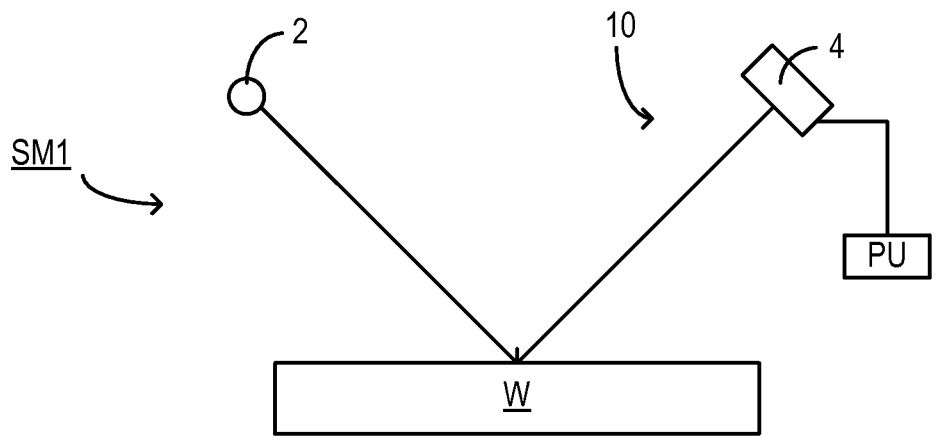
FIG. 3 depicts a first known scatterometer.
Figure 3:
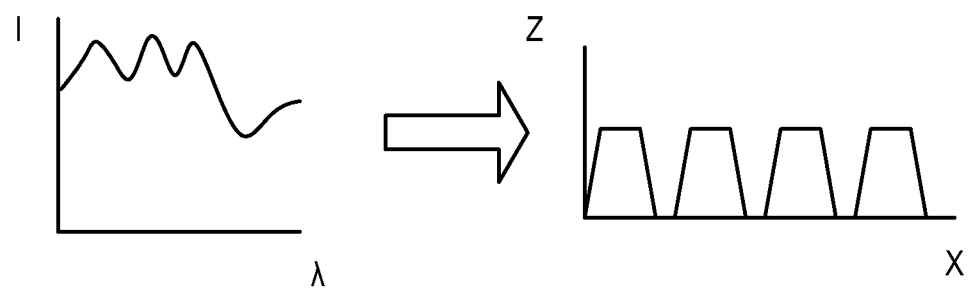

FIG. 3 depicts a known scatterometer. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processor PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
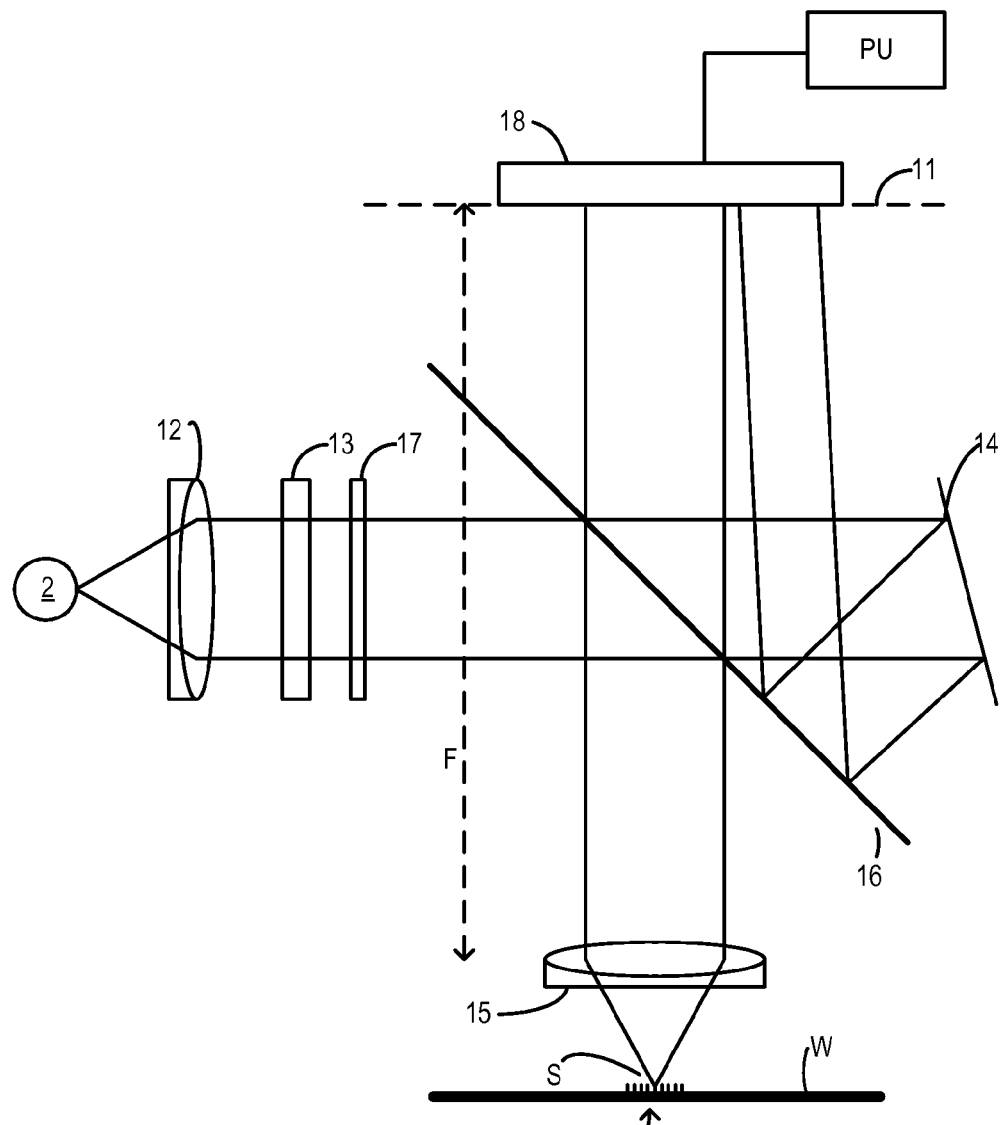
FIG. 4 depicts a second known scatterometer.

Another scatterometer that may be used with an embodiment of the present invention is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via a microscope objective lens 15, which has a high numerical aperture (NA), preferably at least 0.9 and more preferably at least 0.95. Immersion scatterometers may even have lenses with numerical apertures over 1.

As in the lithographic apparatus LA, one or more substrate tables may be provided to hold the substrate W during measurement operations. The substrate tables may be similar or identical in form to the substrate tables WTa, WTb of FIG. 1. In an example where the inspection apparatus is integrated with the lithographic apparatus, they may even be the same substrate tables. Coarse and fine positioners may be provided to a second positioner PW configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system being brought to different locations on the substrate, when in practice the optical system remains substantially stationary and only the substrate moves. Provided the relative position of the substrate and the optical system is correct, it does not matter in principle which one of those is moving in the real world, r if both are moving.

The reflected radiation then passes through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters. An aperture stop or spatial light modulator (not shown) may be provided in the illumination path to control the range of angle of incidence of radiation on the target.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processor PU, from knowledge of the printing step and/or other scatterometry processes.

In addition to measurement of parameters by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or 4 are described for example in published patent application US2006066855A1. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
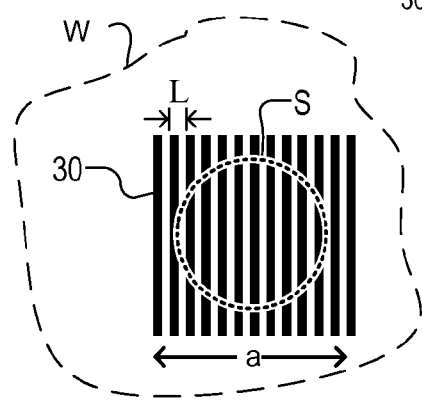
FIG. 5 illustrates the relationship between an illumination spot and a target grating in the known scatterometers.

FIG. 5 illustrates a plan view of a typical target 30, and the extent of illumination spot S in the scatterometer of FIG. 4. To obtain a diffraction spectrum that is free of interference from surrounding structures, the target 30 in the known method is a grating larger than the diameter of the illumination spot S. The diameter of spot S may be over 10 or 20 $\mu m$ and the grating width and length a may be 30 or 40 $\mu m$ square. The grating in other words is 'underfilled' by the illumination, and the diffraction signal is free from interference by product features and the like outside the target grating itself. The illumination arrangement 2, 12, 13, 17 may be configured to provide illumination of a uniform intensity across a pupil plane of objective 15. Alternatively, but including an aperture in the illumination path, illumination may be restricted to on axis or off axis directions.

In recent times, there is much demand from users to reduce the space occupied by metrology targets. In particular, there is a desire to reduce the width of 'scribe lanes' between target portions C on the substrate, where the metrology targets have conventionally been located. Moreover, there is a desire to include metrology targets within the device patterns themselves, to allow more accurate monitoring and correction of variations in parameters such as CD and overlay. To this end, alternative methods of diffraction based overlay have been devised more recently. In image-based overlay metrology, two images of the target are made, each using different selected orders of the diffraction spectrum. Comparing the two images, one can obtain asymmetry information. By selecting parts of the images, one can separate the target signal from its surroundings. The targets can be made smaller, and need not be square, so that several can be included with in the same illumination spot. Examples of this technique are described in published patent applications US20110027704A, US20110043791A, US20120044470, mentioned in the introduction.

As the demand to reduce target sizes continues, however, the known techniques meet some technical limitations. The methods require at least $\pm 1^{st}$ diffraction orders to be captured. Taking into account the Numerical Aperture of the objective 15, this constrains the pitch (L) of the grating. To improve sensitivity and to reduce target size, one can consider using shorter wavelengths $\lambda$. In practice, however, the illumination wavelength has to be in visible range because in an overlay target a bottom grating may be deeply buried and intervening layers absorb UV light (200 nm to 400 nm). The grating cannot be too small otherwise it will not have enough lines to be consider as a grating (typically at least 15 lines are required which taking into account previous constraints fix the minimum grating size around 5 $\mu m \times 5$ $\mu m$). Consequently, overlay is measured on gratings lines having dimensions far bigger than those of the circuit making overlay measurement less reliable. Ideally the grating line and pitch should have similar dimensions to the product features, but this is not attainable in current techniques.

Figure 6:
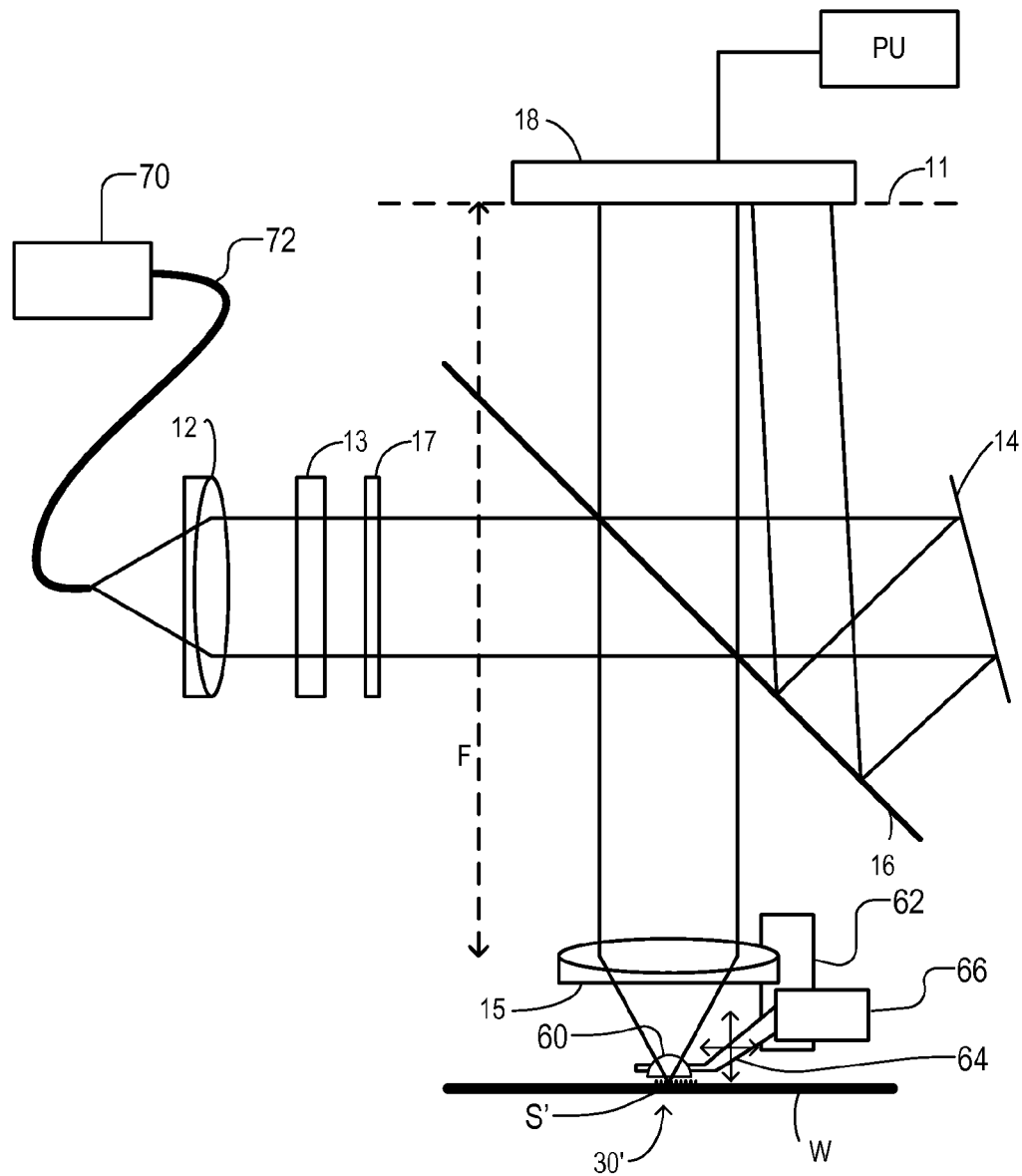
FIG. 6 depicts a scatterometer comprising a so-called solid immersion lens (SIL)

FIG. 6 shows a scatterometer in which a smaller spot S' of illumination can be applied to a smaller grating target 30', which has lines of smaller pitch. Like reference numerals refer to like components throughout the figures. Benefits of inspection using an apparatus comprising an SIL and coherent radiation are described for example in US 2009316979 A1, cited above.

Comparing the apparatus of FIG. 6 with that of FIG. 4, a first difference is the provision of an additional lens element 60 close to the target 30'. This additional lens is a miniature solid immersion lens (SIL), with a diameter only on the order of a millimeter, for example in the range 1 mm to 5 mm, for example about 2 mm. This comprises in one example a hemisphere of material such as glass of refractive index n, that receives rays of light at normal incidence to its surface. These rays come to focus at the center of the hemisphere and form a diffraction-limited spot that is smaller by a factor of n compared to what would have been in the absence of the SIL. A typical glass hemisphere having n=2 will reduce the diameter of the focused spot by a factor of 2. Immersion of lenses in liquid has been used to increase resolution in microscopy and photolithography. The solid immersion lens has been proposed in microscopy and in lithography as a way of achieving similar gains without the inconvenience of liquid immersion. However, to ensure that the smaller spot size does indeed increase the resolution of the system, the bottom of the hemisphere must either be in contact with the target 30 or positioned extremely closely to it. This restricts its practical applications.

So-called micro-SIL lenses may also be used, of which the diameter is many times smaller, for example about 2 microns in diameter instead of about 2 millimeters. In an example where SIL 60 in the FIG. 6 apparatus is a micro-SIL lens, it may have a diameter less than 10 μm, potentially less than 5 μm.

Whether a miniature SIL 60 or a micro-SIL lens is used, it can be attached to a movable support so that to control the alignment and proximity to the sample is much simpler than in the case of a lens with bigger diameter. SIL 60 in FIG. 6 is mounted to a frame 62 supporting objective 15 via an arm 64 and actuator 66. Actuator 66 may be piezoelectric in operation, for example, or voice coil actuated. It may operate in combination with other actuators positioning the objective as a whole in relation to the target. In relation to the coarse and fine positioners mentioned above, for example, the actuator 66 and arm 64 may be regarded as an ultra-fine positioner. The skilled person will appreciate that servo control loops of these different positioners can be integrated with one another in a manner that need not be described here. The components 62, 64 and 66, together with the substrate table and positioners (mentioned above but not shown in FIG. 6 onward), form a support apparatus for positioning the SIL and the target T in close proximity to one another. In principle, SIL 60 could be mounted rigidly to the frame 62, and/or may be of bigger diameter. The separate arm and actuator allow easier control of the very small gap, as discussed below.

Inclusion of the SIL 60 opens the possibility of focusing to a much smaller spot S'. As mentioned, the SIL works by capturing the near-field radiation from the target, and to this end it is positioned substantially closer than one wavelength (λ) of radiation from the target structure, generally closer than a half wavelength, for example around λ/20. The closer the distance, the stronger will be the coupling of near-field signals into the instrument. The air gap between SIL 60 and target 30' may therefore be less than 100 nm, for example between 10 nm and 50 nm. Because the NA of the scatterometer is effectively increased, the pitch of the target grating can also be reduced closer to product dimensions, while still capturing the first order diffraction signals. Alternatively, the pitch can be maintained while capturing second and higher orders. In examples where a micro-SIL would be used, incoherent radiation of the type conventionally used in the scatterometers cannot be focused to a micron-sized spot as small as the micro-SIL. Accordingly, in such an embodiment the light source 2 may be changed to a coherent source. Therefore a laser source 70 is coupled to illumination optics 12 etc. via an optical fiber 72. The limit on the spot size on the wafer is set by the numerical aperture of the focusing lens system and the laser wavelength. As an additional benefit of using spatially coherent light in optical scatterometry, the instrument with laser light source 70 can be used to perform different types of scatterometry. For example, the following papers describe coherent Fourier scatterometry (CFS) for measurement of Structures formed by lithography:

Kumar et al in "Coherent Fourier Scatterometry (Tool for improved sensitivity in semiconductor metrology)" Metrology, Inspection, and Process Control for Microlithography XXVI, edited by Alexander Starikov, 10 Proc. of SPIE Vol. 8324, 83240Q, doi: 10.1117/12.916357

Gawhary et al in "Performance analysis of coherent optical scatterometry", Applied Physics B (2011) 105: 775-781 DOI 10.1007/s00340-011-4794-7.

As highlighted above, a small gap should be maintained between the SIL and the metrology target. As also highlighted above, known techniques for controlling the gap have limitations, particularly when a variety of different target structures and materials have to be inspected. It is therefore proposed to determine and regulate the gap by a technique based on broadband spectroscopy. The technique has particular applicability in optical metrology apparatus such as scatterometers, but can be applied in other applications of SILs. The technique need not be applied exclusively, and could be applied in combination with other techniques, including the ones discussed in the cited documents.

Figure 7:
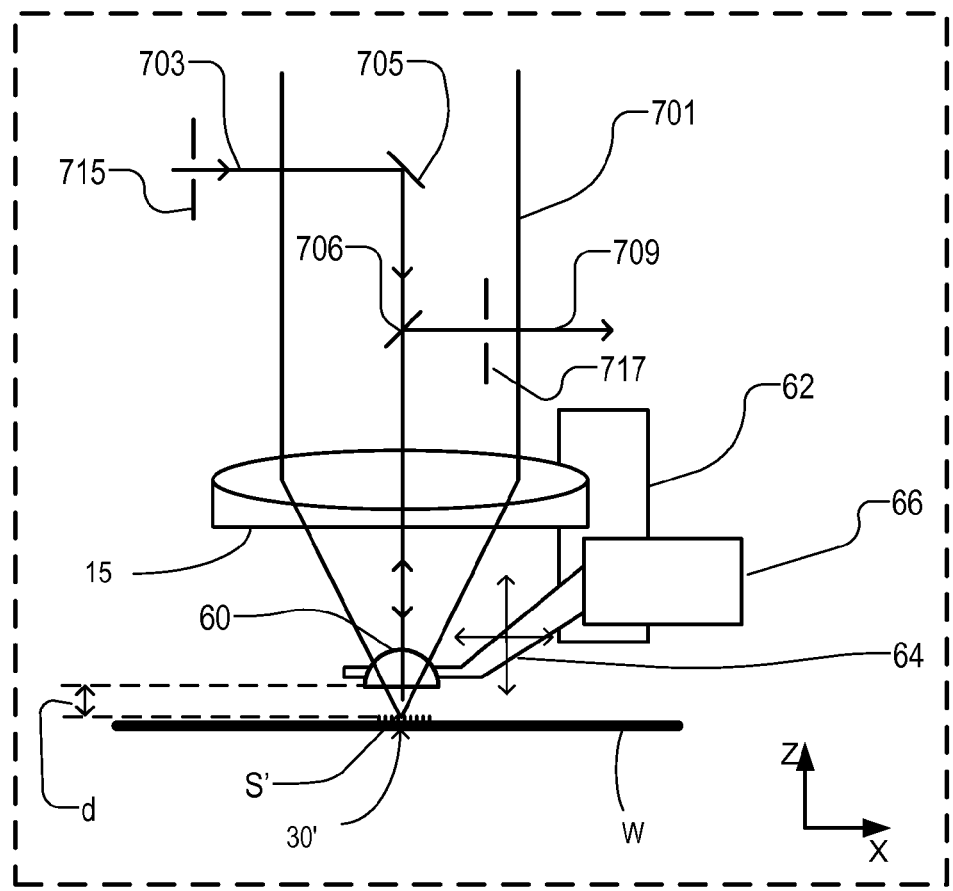
FIG. 7 is an enlarged detail of part of the apparatus of FIG. 5.
Figure 8:
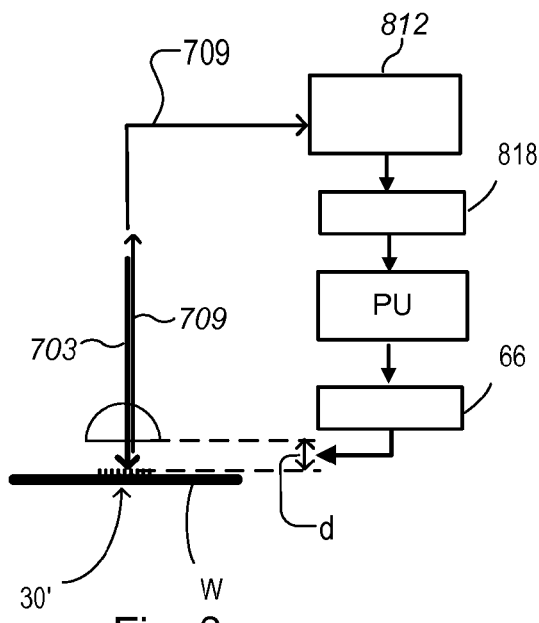
FIG. 8 illustrates schematically the operation of a gap detection and control arrangement in the apparatus of FIG. 6.

FIG. 7 shows a partial enlarged view of the parts close to the metrology target, in the apparatus of FIG. 6. FIG. 7 in particular provides a schematic view of optical paths for use in determining and controlling the gap (i.e. the distance SIL-target in the Z direction) in the apparatus of FIG. 6. FIG. 8 shows schematically the gap determining and controlling system. The gap, which may be referred to as an "air gap", is labeled d. Reference to the air gap is not intended to imply that the medium between SIL 60 and target 30' must be air, or even that it must be gaseous. Air gap is just a convenient term for the gap. The medium within the gap in any particular implementation may be a vacuum or partial vacuum, any gaseous or liquid medium, whose refractive index meets the requirements of the optical functions of the apparatus.

With regard to the function of the apparatus as a scatterometer or other inspection apparatus, a measurement illumination beam labeled 701 follows an illumination path comprising optical components 12, 13, 15, 16, 17, 60 (not shown in the drawing) described above with reference to FIG. 6, and thus will not be discussed in this section. A collection path comprising optical components 60, 15 for collecting radiation reflected by target 30' is also described above with reference to FIG. 6. The radiation collected by optical components of the collection path is directed to a detector 818 connected to processor PU for target reconstruction or other purposes. As mentioned above, an example application of these parameters may be for determining overlay errors. Target 30' may be formed on a substrate W that has been patterned and processed using the lithographic apparatus of FIG. 1 and the cluster of processing tools described above with reference to FIG. 2. The technique disclosed in the present disclosure is not limited to such inspection apparatus. In another application, for example optical recording, illumination paths and collection paths may be similarly arranged.

For determining and controlling the gap d, a broadband radiation beam 703 follows an optical path that will be referred to as the control path. Beam 703 may be referred to as the control beam. The control path in this example is provided by optical components 705 and 706, which may take the form of mirrors or partially-reflective surfaces. Control beam 703 is directed to SIL 60 by optical component 705 though optical component 706. In this example, control beam 703 comprises a narrow beam of broadband radiation that passes through SIL 60 to impinge on target 30' at normal incidence to the substrate surface (i.e. θ=0°, with θ the angle of incidence with respect to the normal). The control beam radiation reflected by target 30' is labeled 709 and is directed by optical component 706 to a detection arrangement (not shown in FIG. 7). An aperture 715 may be placed in the control path to reduce the spectral width of broadband control beam 703 so as to increase the coherence length of the light source. The spectral width of control beam 703 may also be varied for instance by applying an optical coating on optical component 706 so as to select part of the radiation impinging on optical component 705. An aperture stop 717 may also be placed in the control path to select a portion of radiation 709 that is delivered to the detection arrangement.

The broadband light source for generating control beam 703 is not shown in the drawing. A light source emitting radiation of wavelengths ranging from 400 to 900 nm may be used. The light source may be for example a lamp emitting white light or a so-called white light laser. In other embodiments, radiation may be polychromatic (comprising many individual wavelengths), rather than having a continuous broad spectrum. The spectroscopic analysis used in the examples described here is based on the assumption that a broad continuous spectrum is provided. If a non-continuous spectrum is used, the shift can be still be interpolated and calculated if the number of individual lines is sufficient.

Radiation sources for the measurement illumination beam 701 and control beam 703 may be one and the same. In one such embodiment the laser source 70 of FIG. 6 may be replaced by a broadband light source for supplying radiation for both beams 701 and 703, when the application does not require the use of a highly coherent light source. Alternatively, different light sources may be used to generate beams 701 and 703. Further, SIL 60 may also be irradiated obliquely by control beam 703 at an incident angle θ different from zero. The optical arrangement for illuminating the target and collecting the radiation emitted by the target as well as the control path may be adapted accordingly.

FIG. 8 illustrates schematically an arrangement for monitoring and controlling the value of air gap d. The arrangement of FIG. 8 includes a spectrometer 812 having a sensor 818. Radiation 709 is directed to spectrometer 812. The skilled reader will know that a spectrometer breaks an incoming wave into a spectrum of different wavelength components. The spectrum may be generated for example by a diffractive optical element such as a diffraction grating. The spectrum produced by spectrometer 812 is directed to sensor 818 which communicates with a processor PU. Sensor 818 may be for example a linear CCD array. Analysis of the spectrum delivered by sensor 818 may then be performed by processor PU to determine the gap d in a manner to be described below. According to the present disclosure, variation in the value of air gap d may be inferred from a shift in the scattered electromagnetic spectrum. Processor PU then uses the results of the determination to control the value of air gap d to a desired set point by activating actuator 66. In this way, servo control of the very small gap is achieved. The spectroscopic method is more robust than known methods, when applied to a wide range of target materials, layer thicknesses and so forth.

Figure 9A:
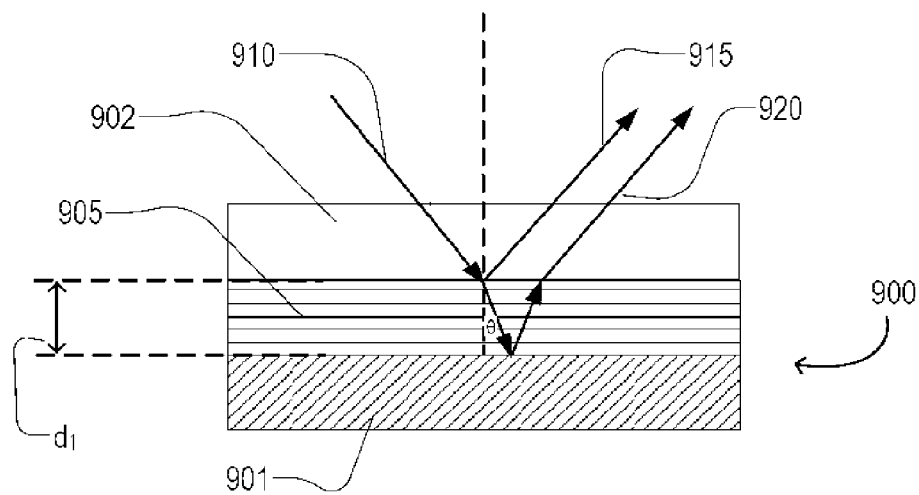
FIG. 9(a) illustrates a multi-layered substrate irradiated at an incident angle θ by a radiation λ.

FIG. 9(a) illustrates the principle of operation of the arrangement of FIG. 8. A multi-layered substrate 900 irradiated at an incident angle θ by radiation 910 of wavelength λ, the angle θ being formed between radiation 910 and the normal to layers 905 within medium 905. Substrate 900 includes three layers having different optical properties: an underlying layer 901, a top layer 902 and an intermediate layer 905 with a thickness $d_1$ and a complex index of refraction $n_1$. The substrate in a real product may have a form similar to this, or it may have a much more complex form with more layers, and/or localized structures such as grating lines. An air gap, or liquid may constitute a layer in itself. The simple illustration is enough to explain the principles of the gap controlling arrangement, however. Radiation 910 undergoes a series of reflection and refraction at the interfaces between layers. Radiation 915 represents a fraction of radiation 910 that is reflected from the upper surface of layer 905. Radiation 920 represents a fraction of radiation 910 that transmitted through the upper surface of layer 905, is reflected from the lower surface of layer 905 and transmitted through the upper surface of layer 905. The resulting contribution to the total reflection coefficient r of layer 905 is given by equation (1):

$$r = \frac{r_{915} + r_{920} e^{\frac{-4i\pi d_1 n_1 \cos\theta}{\lambda}}}{1 + r_{915} r_{920} e^{\frac{-4i\pi d_1 n_1 \cos\theta}{\lambda}}}, \tag{1}$$

with $r_{915}$ and $r_{920}$ the reflection coefficient of the interfaces between layers 902/905 and 901/905, respectively.

As can be seen from equation (1), a change in the thickness $d_1$ causes a change in the total reflection coefficient r as a function of λ. The thickness $d_1$ may be compared to air gap d in the apparatus of FIGS. 6 to 8, in the case where layer 905 is the air layer positioned between the SIL and the target. The target may be compared to layer 901. Other layers below layer 901 may also contribute their own reflection coefficients, by extension of equation (1) to additional interfaces, refractive indices and so forth. The quantity r is the effective reflection coefficient of this target, which is a complex quantity. Sensor 818 would normally measure the intensity of reflected radiation at each given wavelength, which depends on the intensity of the illuminating radiation and the total reflectance R. As is well-known to the skilled reader, intensity and reflectance are scalar quantities, where reflectance R is the square of reflection coefficient r.

From the above discussion, it will be seen that the total measured intensity depends on one or more (d/λ) relationships. Now, each of these relationships can result in one or more peaks and troughs being present in the reflected intensity over the wavelength spectrum. Moreover, for each of these (d/λ) relationships, if d increases by a small amount equal to ∂d a same total reflectance R may be observed at a wavelength shifted by ∂λ as shown in equation (2):

$$\frac{d}{\lambda} \cong \frac{d + \partial d}{\lambda + \partial \lambda} \to \partial \lambda = \frac{\lambda \partial d}{d} \quad (2)$$

Consequently, given that the value of air gap d is smaller than the coherence length of the incident radiation, the reflected electromagnetic spectrum will exhibit a shift of wavelengths that is proportional to (and of the same order as) the variation in the value of air gap, the air gap value and the wavelength of the incident radiation. For instance, an incident radiation of a large wavelength would be shifted by a large amount.

Regarding the coherence length of the incident radiation a broadband light source having a Gaussian spectral distribution, the coherence length (CL) of the light is given by:

$$CL > \frac{\lambda^2}{\Delta \lambda}$$

with $\Delta\lambda$ the spectral width of the light source, $\lambda$ the mean wavelength emitted by the light source For instance, for a light source emitting radiation of wavelengths ranging from 400 to 900 nm with $\lambda$=650 nm, and $\Delta\lambda$=500 nm, coherence length CL will be approximately 845 nm. When there is refection of light waves from a multilayer arrangement at an angle $\theta$ to the normal, light travels in a roundtrip and thus for a light wave reflected from one layer and for another wave reflected from a layer below to interfere, the total gap between the layers should be less than $$d > \frac{\lambda^2}{2\cos(\theta)\Delta\lambda}$$

Consequently, one can expect that an air gap d can be monitored from a distance SIL to target of the order of 400 nm and below.

Figure 9B:
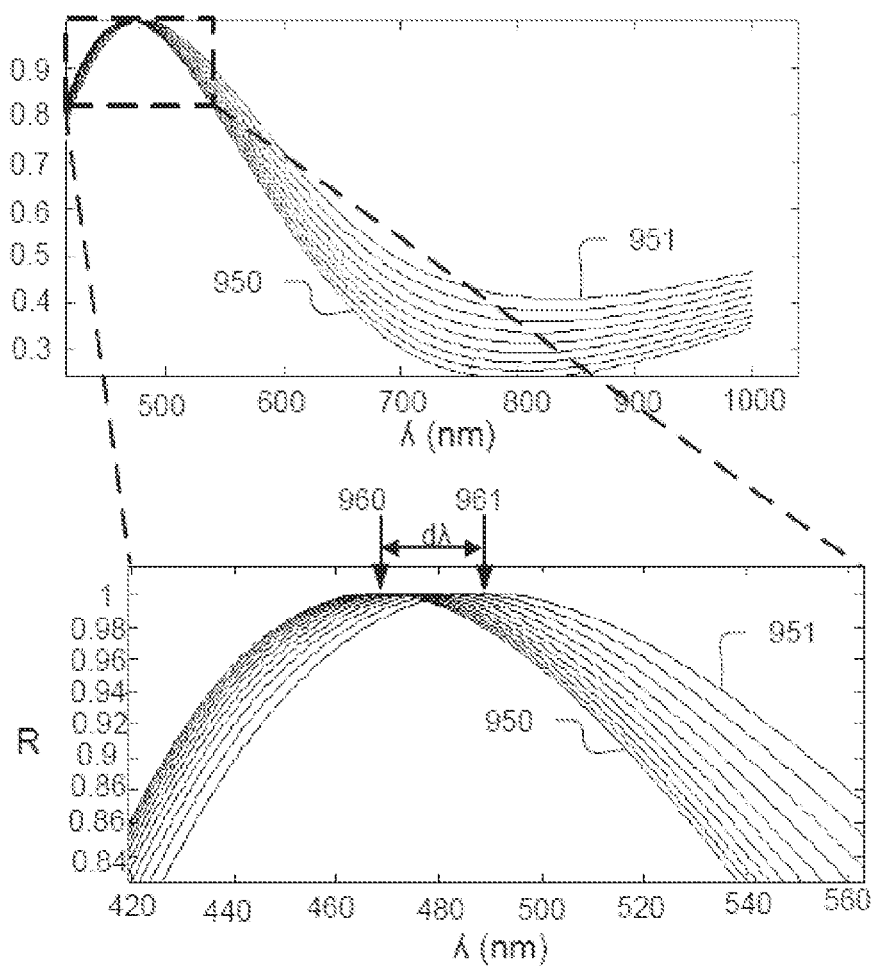
FIG. 9(b) presents simulation results showing a shift of the wavelengths in spectra obtained for various air gap values.

FIG. 9(b) shows results of a simulation of normalized reflectance spectra for different air gap values d, in a set-up similar to that shown in FIG. 9(a). The horizontal axis represents wavelengths $\lambda$ in nm and the vertical axis represents a normalized reflectance R of a modeled system comprising an air gap positioned between an SIL and a reflective surface. Each of the curves represents a spectrum of the light collected at a given air gap. As can be seen from the simulation results, a shift of the wavelengths is observed when the air gap value is varied. In this simulation, curve 950 is obtained at an air gap value of 20 nm and curve 951 is obtained at an air gap value of 30 nm, with intermediate values giving the intermediate curves (not labeled). The lower part of the drawing shows an enlarged detail in the vicinity of a peak in the curves. In this example, a peak 960 of curve 950 is observed at a wavelength of around 470 nm. When the air gap value varies, peak 961 of curve 951, corresponding to peak 960 of curve 950, is now observed at a wavelength of around 490 nm. The shift in the wavelength $\partial\lambda$ of about 20 nm corresponds to a variation in the air gap value of about 10 nm. The factor of two difference in these values is consistent with the observation that an change $\delta d$ in gap d involves a change in path length of $2\delta d$ for the radiation traversing the gap and being reflected back again.

The shape of the spectra may also vary. Because a typical target will be a multilayer structure, several series of peaks and troughs may be present in a real spectrum. Variations of the shape are mainly process dependent and, as a by-product of the gap monitoring process, processor PU may provide information on the target material, layer heights and so forth. An absolute reflectivity of a substrate may be obtained after calibration of the spectrum of the radiation source and the wavelength dependent transmission of the optical components of the optical arrangement. The optical arrangement allows detection in a single measurement of spectra having a wide range of wavelengths. The wavelengths used can range for example down to 200 nm and/or up to 1000 nm.

Figure 10:
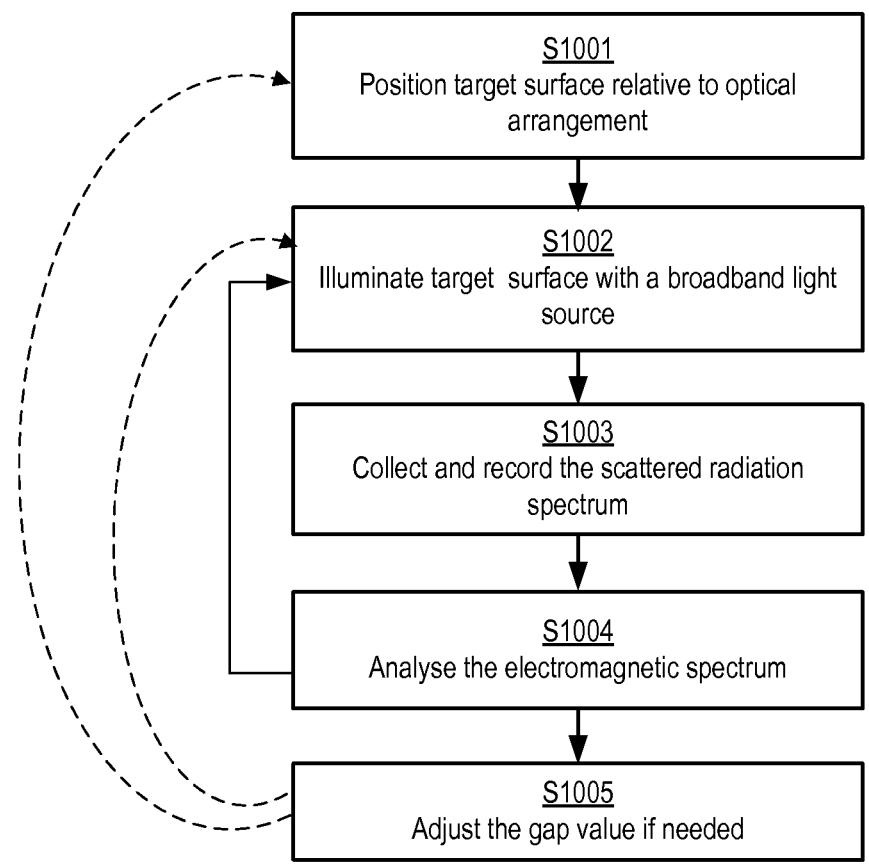
FIG. 10 is a flow chart showing an example method for air gap control.

FIG. 10 is a flow chart showing an example method for determining and controlling a gap between components in an optical apparatus. The method in general is implemented by optical and electronic hardware components, in combination with suitable programming instructions provided to processor PU. The gap may be for example an air gap between a high numerical aperture optical arrangement and a reflective or diffractive surface, referred to in this example as the target surface. The high numerical aperture optical arrangement may be for instance the optical arrangement comprising objective 15 and SIL 60 shown in FIG. 7 and the reflective or diffractive surface may be for instance target 30' of FIG. 7. The gap may more generally be between any two components in an optical system.

The method comprises the following steps:

S1001: A target structure comprising for example a metrology target on a substrate is positioned, at a predefined position in the X-Y-Z directions, relative to the optical arrangement. A 'coarse' positioning (with an accuracy of the order of hundreds of nm) of the diffractive surface relative to the high numerical aperture optical arrangement may be performed using other sensors, if necessary to set the gap value within a pre-defined coherence length of the light to be used for fine control. Conventional substrate supports and positioning systems can be used for this step. A 'fine' positioning in the Z direction controls the gap by following the steps described below.

S1002: Radiation from a broadband light source is directed through the optical arrangement onto the target surface.

S1003: The radiation scattered by the target is collected by the optical arrangement and directed to a spectrometer. The spectrometer produces a spectrum that is recorded by a sensor connected to the spectrometer and to a processor PU. In the apparatus of FIGS. 7 and 8, the spectrometer 812 having sensor 818 is used.

S1004: Processor PU analyses the detected spectrum and stores the analysis output. To monitor variations of the wavelengths in a detected spectrum, steps S1002-S1004 can be repeated continuously and the analysis output is compared to analyses of spectra measured previously or with a given spectral distribution. Variations of the wavelengths in detected spectra may be monitored by any suitable numerical technique, or by a combination of techniques. Examples are given below. Variations in the air gap value can then be deduced from the variations of the wavelengths in the spectra.

S1005: Assuming that the gap is to be controlled in a servo loop, the gap value is compared to a set value, and processor PU may then issue commands to reposition the optical arrangement relative to the target surface. In the example of the inspection apparatus of FIGS. 6 to 8, the gap is adjusted using actuator 66.

With regard to step S1004, the calculation of the gap or gap variation can be implemented in a number of ways. One way is to implement directly the principle of analysis described above in the example of FIG. 9(b). One or more peaks and/or troughs are identified in the spectrum, by searching the curve 950 for a local maximum (peak) or minimum (trough). The location of each identified local maximum (960 for example) or minimum can then be tracked as the spectrum shifts. Several local extrema (maxima and/or minima) can be identified and tracked. Their individual variations can be combined statistically to improve accuracy. Another approach would be to compute a Fourier transform of the spectrum. A typical spectrum will have one of more periodic components in it. The shift of frequency in the spectrum will be represented as a shift of phase in the Fourier transform. Other techniques such as pattern recognition may be applied. The reader skilled in the art will recognize that algorithms of the flow chart may be implemented via coding of a suitable software program to be performed by processor PU or its equivalent in the form of a dedicated microprocessor or the like.

The air gap values obtained using the method and associated apparatus discussed herein may be calibrated against air gap values delivered by for example an air gauge system or other source of reliable measurements. A reference spectrum for any given target surface may be obtained by measurement with gap d at values longer than the coherence length of the radiation. Only when the gap reduces below the coherence length, the spectrum will begin to shift with decreasing gap d. In an application where many different substrate types and process steps are to be monitored, a one-time calibration can be performed for every new lithographic process/layer. This will be done as a part of a normal whole sensor calibration sequence, involved in setting up the metrology 'recipe' for a new process or product type.

Further, because the air gap value may be of the order of 10s of nm and if several metrology targets spaced across a substrate have to be sampled, it may be inconvenient to keep such a small gap while moving from target to target. After sampling of a first target the table holding the substrate may be moved away from the target surface in a Z direction, before being moved in the X-Y directions so as to position a second target to be sampled at a pre-defined position before positioning the target surface in the Z direction as defined in the method of FIG. 10 etc Alternatively, an X-Y movement may be performed while continuously controlling the gap to 'fly' the optical arrangement at a predetermined 'height' across the target surface. Such a mode of operation would be appropriate for example where the method is being used in an optical recording system.

Figure 11:
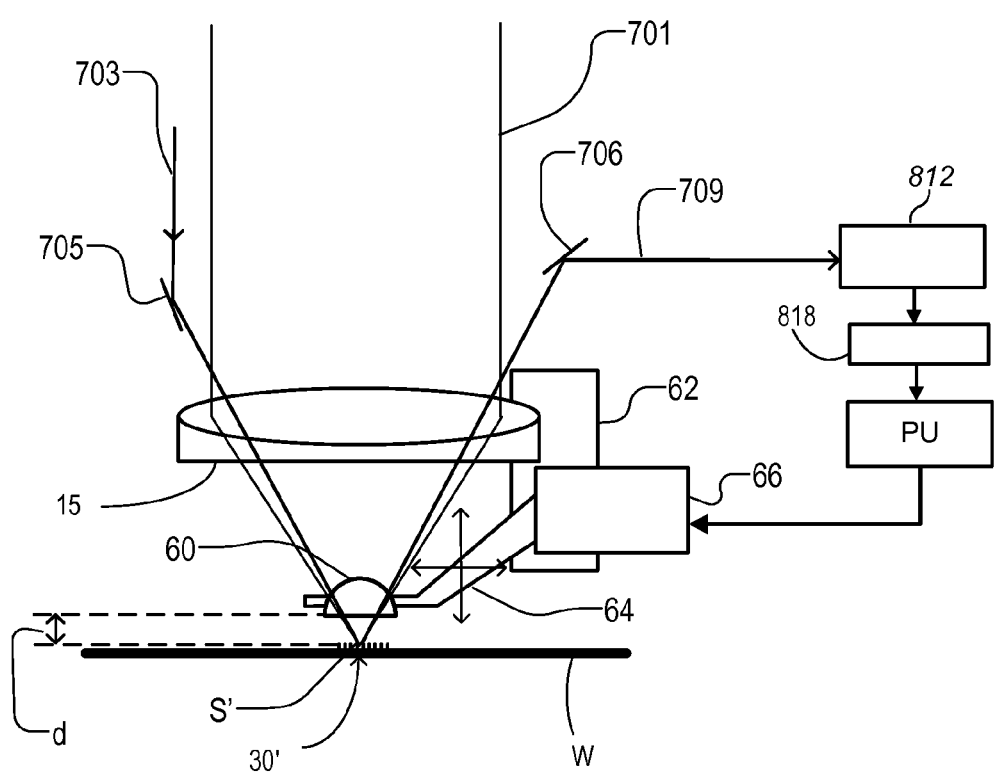
FIG. 11 presents in a form of a simplified drawing an example arrangement comprising a metrology target irradiated obliquely with respect to its normal.

FIG. 11 presents in a form of a simplified drawing an example arrangement comprising a metrology target irradiated obliquely with respects to its normal. Target 30' is irradiated obliquely by radiation 703 via optical component 705. Radiation 709 reflected by target 30' is directed to a detection arrangement as described in FIG. 8. Note that at oblique illumination, the surface reflectivity varies with the polarization of the incident light.

CONCLUSION

In conclusion, a method and associated apparatus for monitoring and regulating the gap between components in an optical system is disclosed. For instance, the use of a broadband light source reduces process-dependent artefacts, and will work reliably with a wider range of target surfaces and structures. This method also provides useful information related to thin film metrology. For instance, the shape of the spectrum can be used to infer optical constants of the target material such as n and k (the real and imaginary parts of refractivity, respectively). By reducing the spectral width Δλ of the light source, the coherence length can be increased and the air gap can be monitored from a larger distance.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

Further embodiments according to the invention are provided in below numbered clauses:

1. A method for monitoring a gap between an optical element and a target surface, the method comprising the steps:

(a) positioning a target surface at a distance relative to the optical element;

(b) using the optical element to illuminate a part of the target surface with radiation comprising different wavelengths;

(c) collecting radiation reflected by the target surface back into the optical element;

(d) measuring an electromagnetic spectrum of the collected radiation; and (e) deriving information about the distance between the optical arrangement and the target surface based on a shift in wavelength of one or more features in the spectrum.

2. A method according to clause 1 wherein the radiation comprising different wavelengths has a substantially continuous spectrum over a range of wavelengths and the step (e) is performed to derive information about the distance at least when the distance is less than a coherence length of the radiation.

3. A method according to clause 1 or 2 wherein the optical element and target surface are illuminated with the radiation at substantially normal incidence.

4. A method according to clause 1 or 2 wherein the optical element and target surface are illuminated with the radiation at oblique incidence.

5. A method according to any preceding clause wherein in step (e) a Fourier transform is performed on at least a portion of the spectrum, the Fourier transform being used to determine a shift in wavelength of features in the spectrum.

6. A method according to any preceding clause wherein step (e) comprises identifying one or more local extrema in the spectrum and tracking changes in wavelength of the local extrema.

7. A method according to any preceding clause further comprising (f) adjusting the distance between the optical element and the target surface in response to the distance information derived in step (e).

8. A method according to clause 7 wherein steps (b) to (f) are repeated continuously to implement servo control of the distance between the optical element and the target surface.

9. A method according to any preceding clause wherein the optical element is all or part of an objective lens system of an inspection apparatus.

10. A method according to clause 9 wherein the optical element is a solid immersion lens element associated with an objective lens of the inspection apparatus.

11. A method according to any preceding clause further comprising measuring a property of the target surface using radiation transmitted between the optical element and the target surface.

12. A method according to any preceding clause wherein the target surface includes one or more structures formed by lithographic process.

13. An apparatus for monitoring a gap between an optical element and a target surface, the apparatus comprising:
support apparatus for supporting a target surface and an optical element in proximity to one another with a distance between them;
an illumination optical system for delivering through the optical element radiation to illuminate a part of the target surface, the radiation comprising different wavelengths;
a collecting optical system for collecting from the optical element radiation reflected by the target surface back into the optical element;
a spectrometer for measuring an electromagnetic spectrum of the collected radiation; and
a processor for identifying a shift in wavelength of one or more features in the measured spectrum and for deriving from the measured shift information about the distance between the optical element and the target surface.

14. An apparatus according to clause 13 wherein the radiation comprising different wavelengths has a substantially continuous spectrum over a range of wavelengths and the support apparatus is arranged to operate with the distance less than a coherence length of the radiation.

15. An apparatus according to clause 13 or 14 wherein the optical element and target surface are arranged to be illuminated with the radiation at substantially normal incidence.

16. An apparatus according to clause 13 or 14 wherein the optical element and target surface are arranged to be illuminated with the radiation at oblique incidence.

17. An apparatus according to any of clauses 13 to 16 wherein said processor is arranged to perform a Fourier transform on at least a portion of the spectrum, and to use the Fourier transform to determine a shift in wavelength of features in the spectrum.

18. An apparatus according to any of clauses 13 to 17 wherein said processor is arranged to identify one or more local extrema in the spectrum and to track changes in wavelength of the local extrema.

19. An apparatus according to any of clauses 13 to 18 wherein the processor and the support apparatus are arranged to adjust the distance between the optical element and the target surface in response to the distance information derived by the processor.

20. An apparatus according to clause 19 wherein the processor and support apparatus are arranged to implement servo control of the distance between the optical element and the target surface.

21. An inspection apparatus comprising an optical system for optically inspecting target structures on a substrate, wherein the optical system of the inspection apparatus includes the optical element of an apparatus according to any of clauses 13 to 20.

22. An inspection apparatus according to clause 21 wherein the optical element is a solid immersion lens element associated with an objective lens of the inspection apparatus.

23. An inspection apparatus according to clause 21 or 22 wherein said processor is further arranged to calculate measurements of a property of the target surface using radiation transmitted between the optical element and the target surface.

24. A computer program product comprising program code that, when executed by a processor in an optical apparatus, is arranged to identify a shift in wavelength of one or more features in a measured spectrum and to derive from the measured shift information about the distance between an optical element and a target surface.

The invention claimed is:

1. A method for monitoring a gap between an optical element and a target surface, the method comprising:
positioning the target surface at a distance relative to the optical element;
using the optical element to illuminate a part of the target surface with radiation comprising different wavelengths;
collecting radiation reflected by the target surface back into the optical element;
measuring an electromagnetic spectrum of the collected radiation; and
deriving information about the distance between the optical element and the target surface based on a shift in wavelength of one or more features in the spectrum, wherein the distance is less than a coherence length of the radiation.

2. The method as claimed in claim 1, wherein the radiation comprising different wavelengths comprises a continuous spectrum over a range of wavelengths and the deriving is performed based on a shift in the wavelength of the one or more features in the spectrum compared to one or more features in a previously measured spectrum or one or more features in a given spectral distribution.

3. The method as claimed in claim 1, wherein the optical element and the target surface are illuminated with the radiation at normal incidence.

4. The method as claimed in claim 1, wherein the optical element and the target surface are illuminated with the radiation at oblique incidence.

5. The method as claimed in claim 1, wherein the deriving comprises performing a Fourier transform on at least a portion of the measured spectrum, the Fourier transform being used to determine the shift in the wavelength of the one or more features in the measured spectrum.

6. The method as claimed in claim 1, wherein the deriving comprises identifying one or more local extrema in the measured spectrum and tracking changes in wavelength of the local extrema.

7. The method as claimed in claim 1, further comprising adjusting the distance between the optical element and the target surface in response to the distance information derived in the deriving.

8. The method as claimed in claim 7, wherein the using, the collecting, the measuring, the deriving, and the adjusting are repeated continuously to implement servo control of the distance between the optical element and the target surface.

9. The method as claimed in claim 1, wherein the optical element is all or part of an objective lens system of an inspection apparatus.

10. The method as claimed in claim 9, wherein the optical element comprises a solid immersion lens element associated with the objective lens system of the inspection apparatus.

11. An apparatus for monitoring a gap between a first optical element and a target surface, the apparatus comprising:
one or more optical components configured to deliver, through the first optical element, radiation to illuminate a part of the target surface, the radiation comprising different wavelengths, wherein the first optical element is positioned at a distance relative to the target surface;
a second optical element configured to collect radiation reflected by the target surface back into the first optical element;
a spectrometer configured to measure an electromagnetic spectrum of the collected radiation; and
a processor configured to identify a shift in wavelength of one or more features in the measured spectrum compared to one or more features in a previously measured spectrum or one or more features in a given spectral distribution and to derive from the identified shift information about the distance between the first optical element and the target surface.

12. The apparatus as claimed in claim 11, wherein the radiation comprising different wavelengths comprises a continuous spectrum over a range of wavelengths and the support apparatus is arranged to operate with the distance less than a coherence length of the radiation.

13. The apparatus as claimed in claim 11, wherein the first optical element and the target surface are arranged to be illuminated with the radiation at normal incidence.

14. The apparatus as claimed in claim 11, wherein the first optical element and the target surface are arranged to be illuminated with the radiation at oblique incidence.

15. The apparatus as claimed in claim 11, wherein the processor is further configured to perform a Fourier transform on at least a portion of the measured spectrum, and to use the Fourier transform to determine the shift in the wavelength of the one or more features in the measured spectrum.

16. The apparatus as claimed in claim 11, wherein the processor is further configured to identify one or more local extrema in the measured spectrum and to track changes in wavelength of the local extrema.

17. The apparatus as claimed in claim 11, wherein the processor and the support apparatus are configured to adjust the distance between the first optical element and the target surface in response to the distance information derived by the processor.

18. The apparatus as claimed in claim 17, wherein the processor and support apparatus are configured to implement servo control of the distance between the first optical element and the target surface.

19. A system, comprising:
an inspection apparatus configured to optically inspect target structures on a target surface of a substrate; and
an apparatus configured to monitor a gap between a solid immersion lens element associated with an objective lens of the inspection apparatus and the target surface, the apparatus comprising:
one or more optical components configured to deliver through the solid immersion lens element, radiation to illuminate a part of the target surface, the radiation comprising different wavelengths;
the objective lens configured to collect radiation reflected by the target surface back into the solid immersion lens element;
a spectrometer configured to measure an electromagnetic spectrum of the collected radiation; and
a processor configured to identify a shift in wavelength of one or more features in the measured spectrum and for deriving, from the measured shift, information about the distance between the solid immersion lens element and the target surface.

20. A method, comprising:
positioning a target surface at a distance relative to an optical element;
using the optical element to illuminate a part of the target surface with radiation comprising different wavelengths;
collecting radiation reflected by the target surface back into the optical element;
measuring an electromagnetic spectrum of the collected radiation; and
using a non-transient computer readable medium comprising machine-readable instructions to cause one or more processors to identify a shift in wavelength of one or more features in a measured spectrum and to derive, from the measured shift, information about the distance between the optical element and the target surface,
wherein the radiation comprising different wavelengths comprises a continuous spectrum over a range of wavelengths, and
wherein the deriving is performed to derive information about the distance at least when the distance is less than a coherence length of the radiation.

* * * * *